United States Patent [19]

Oritani

[11] 4,433,393

[45] Feb. 21, 1984

[54] SEMICONDUCTOR MEMORY DEVICE

[75] Inventor: Atsushi Oritani, Yokohama, Japan

[73] Assignee: Fujitsu Limited, Kawasaki, Japan

[21] Appl. No.: 310,975

[22] Filed: Oct. 13, 1981

[30] Foreign Application Priority Data

Oct. 15, 1980 [JP] Japan ................................ 55-144161

[51] Int. Cl.³ .............................................. G11C 7/00
[52] U.S. Cl. .................................... 365/203; 365/190
[58] Field of Search ............... 365/154, 155, 156, 190, 365/203

[56] References Cited

U.S. PATENT DOCUMENTS 3,936,810  2/1976  Dunn .................................... 365/190
4,379,344  4/1983  Ozawa et al. ........................ 365/190

FOREIGN PATENT DOCUMENTS 54-132139 10/1979 Japan .................................. 365/203

*Primary Examiner*—Stuart N. Hecker
*Attorney, Agent, or Firm*—Staas & Halsey

[57] ABSTRACT

A static type semiconductor RAM device having a plurality of memory cells disposed at the cross points between word lines and bit lines, load circuits each connected between one of the bit lines and a voltage source, and, a charging circuit which electrically charges all the bit lines during the short time when all the word lines are in a non-selected condition.

7 Claims, 7 Drawing Figures

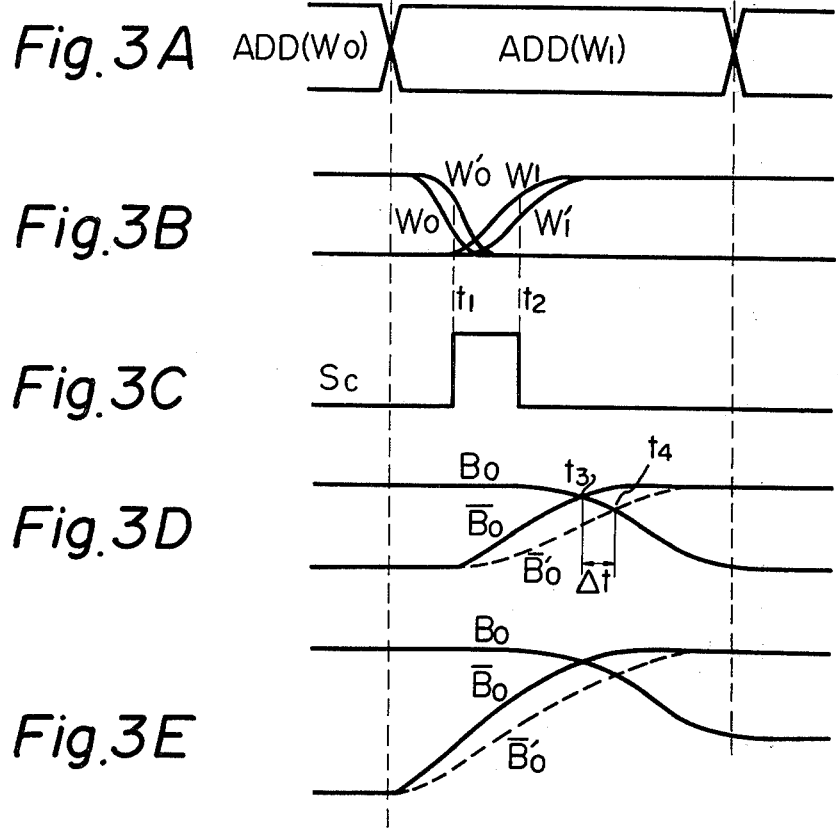

SEMICONDUCTOR MEMORY DEVICE

BACKGROUND OF THE INVENTION

1. Field of the Invention

The present invention relates to a semiconductor memory device, more particularly to a static type semiconductor RAM (Random Access Memory) device having a large memory capacity and a high operating speed.

2. Description of the Prior Art

In general, the current consumption of memory cells and bit lines of a static type RAM device becomes large according to an increase in the memory capacity, i.e., according to an increase in the number of the memory cells. Therefore, especially in a RAM device having a large memory capacity, the gm of each of the load transistors connected to the bit lines is caused to be small in order to decrease the current consumption of the bit lines.

As illustrated in FIG. 1, a conventional static type RAM device comprises a plurality of memory cells $MC_{0,0}$, $MC_{1,0}$, ...; word lines $W_0$, $W_1$, ...; pairs of bit lines $B_0$ and $\overline{B}_0$, ...; word decoders $WD_0$, $WD_1$, ...; and load MIS transistors $Q_1$, $Q_2$, ... for each of the bit lines $B_0$ and $\overline{B}_0$. Each of the memory cells $MC_{0,0}$, $MC_{1,0}$, ... has the same circuit structure and comprises load resistors $R_1$ and $R_2$ and MIS transistors $Q_3$ through $Q_6$. The drain electrodes and the gate electrodes of the transistors $Q_5$ and $Q_6$ are cross-coupled so as to form a flip-flop type memory cell circuit.

In the memory device of FIG. 1, when, for example, the word line $W_0$ is selected by address signals ADD and the output potential of the word decoder $WD_0$, i.e., the word line $W_0$ becomes the potential level for a selected condition, for example high, the transistors $Q_3$ and $Q_4$ are both turned on. In this condition, if the transistors $Q_6$ of the memory cell $MC_{0,0}$ is in an on state, a current flows from a voltage source $V_{DD}$ through the transistors $Q_2$, $Q_4$ and $Q_6$ to another voltage source $V_{SS}$ so that the potential of the bit line $\overline{B}_0$ becomes low. Since the transistor $Q_5$ of the same memory cell $MC_{0,0}$ is in a turned off condition, the potential level of the bit line $B_0$ is high. The potential difference between the bit lines $\overline{B}_0$ and $B_0$ is detected by a sense amplifier (not shown in the drawing) and information from the selected memory cell $MC_{0,0}$ is provided as an output.

In the above-mentioned RAM device, if the memory cell $MC_{1,0}$ is selected next after the memory cell $MC_{0,0}$ and if the memory cell $MC_{1,0}$ stores a different data from that of the memory cell $MC_{0,0}$, i.e., a transistor $Q'_5$ is in a turned on condition and a transistor $Q'_6$ is in a turned off condition, it is necessary to electrically charge the bit line $\overline{B}_0$ to a high potential level quickly. However, since, as aforementioned, the gm of the load transistors $Q_1$ and $Q_2$ is caused to be small in order to decrease the current consumption of the bit lines of a memory device having a large memory capacity, it is impossible to quickly charge the bit line $\overline{B}_0$ from low to high. Therefore, the access time of such a conventional memory device cannot be short. If the read-out of information from the memory cell $MC_{1,0}$ is effected just after the write-in of information to the memory cell $MC_{0,0}$ and if the memory cell $MC_{1,0}$ stores data different from that written into the memory cell $MC_{0,0}$, it is necessary to electrically charge the bit line, for example, $\overline{B}_0$, from a very low potential (e.g. 0 V) to a high potential (e.g. 3 V), so that the access time of the RAM device becomes still longer than that in the above-mentioned case.

SUMMARY OF THE INVENTION

It is, therefore, the principal object of the present invention to decrease the access time of a static type RAM device having a large memory capacity without increasing the current consumption in a steady state operation.

According to the present invention, there is provided a semiconductor memory device comprising a plurality of word lines, a plurality of bit lines, a plurality of memory cells disposed at the cross points between the word lines and the bit lines and load circuits each connected between one of the bit lines and a voltage source, a memory cell disposed at the cross point of a word line and a bit line being selected by selecting said word line and the bit line, characterized in that the memory device comprises, besides the load circuits, a charging circuit which electrically charges all the bit lines during the switching period of word address signals.

BRIEF DESCRIPTION OF THE DRAWINGS

FIG. 3A through FIG. 3E are waveform diagrams illustrating the operation of the RAM device of FIG. 2.

DESCRIPTION OF THE PREFERRED EMBODIMENT

Figure 1:
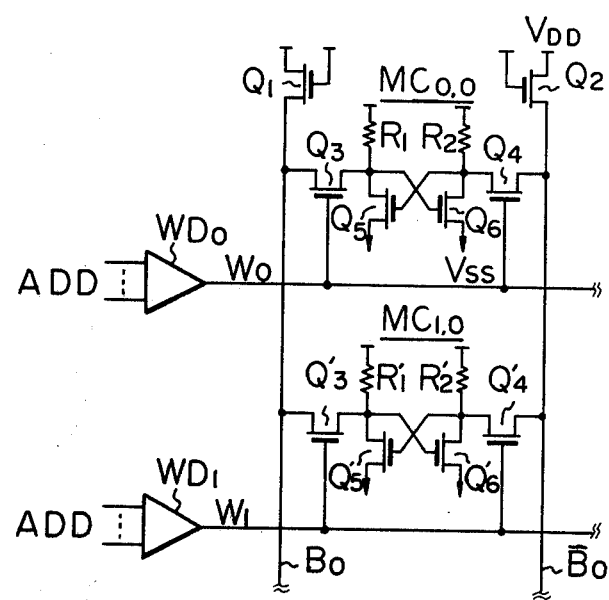
FIG. 1 is a partial circuit diagram illustrating a known conventional static type RAM device.
Figure 2:
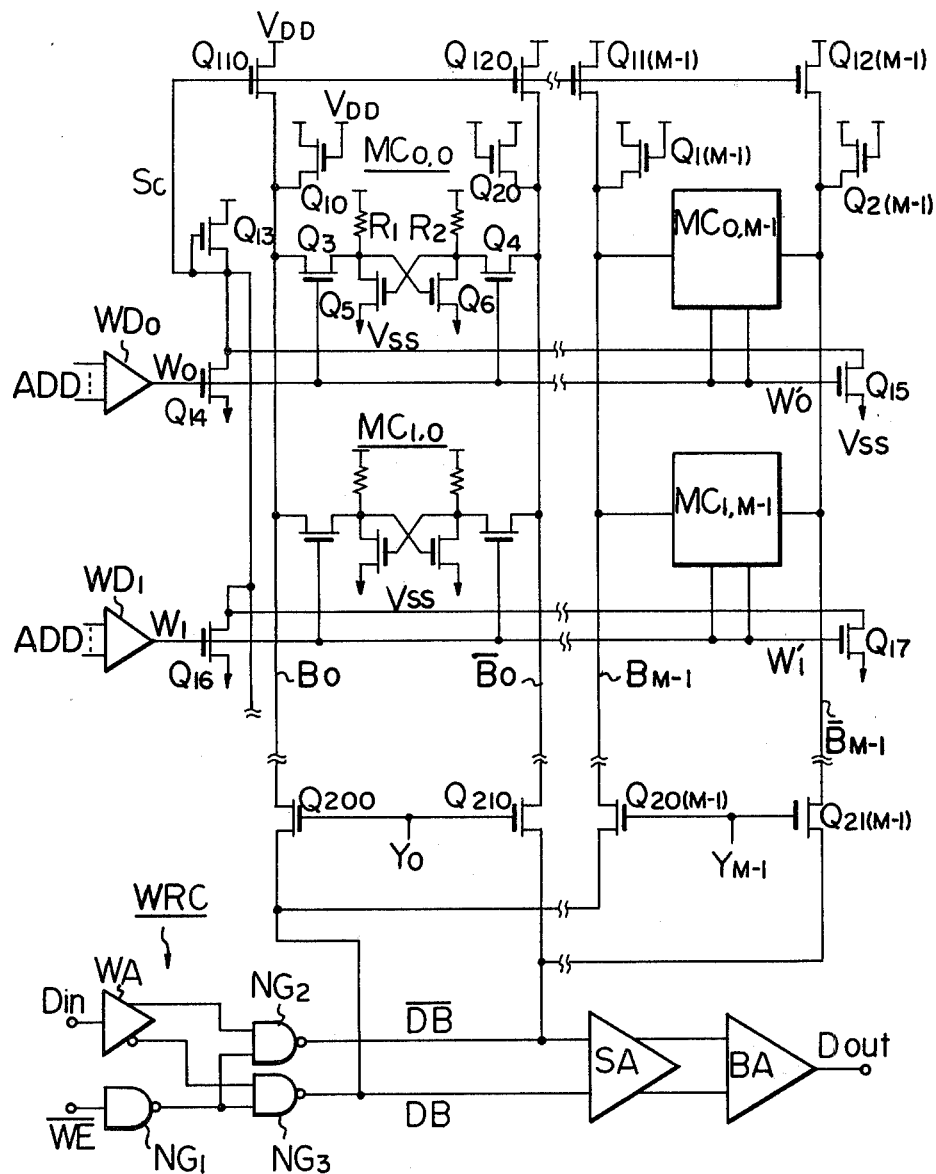
FIG. 2 is a partial circuit diagram illustrating a static type RAM device according to the present invention.

FIG. 2 illustrates a static type RAM device as an embodiment of the present invention. In FIG. 2, the same parts as appear in FIG. 1 are designated by the same reference symbols. The RAM device of FIG. 2 includes a plurality of memory cells $MC_{0,0}$, ..., $MC_{0,M-1}$, $MC_{1,0}$, ..., $MC_{1,M-1}$, ... disposed at cross points between a plurality of word lines $W_0$, $W_1$, ... and a plurality of pairs of bit lines $B_0$ and $\overline{B}_0$ through $B_{M-1}$ and $\overline{B}_{M-1}$; a plurality of word decoders $WD_0$, $WD_1$, ... connected to the word lines $W_0$, $W_1$, ... respectively; and pairs of gate transistors $Q_{200}$ and $Q_{210}$ through $Q_{20(M-1)}$ and $Q_{21(M-1)}$ connected to the pairs of bit lines $B_0$ and $\overline{B}_0$ through $B_{M-1}$ and $\overline{B}_{M-1}$ respectively, and controlled by column decode signals $Y_0$ through $Y_{M-1}$ respectively. The RAM device of FIG. 2 further comprises load transistors $Q_{10}$ and $Q_{20}$ through $Q_{1(M-1)}$ and $Q_{2(M-1)}$ connected between the pairs of the bit lines $B_0$ and $\overline{B}_0$ through $B_{M-1}$ and $\overline{B}_{M-1}$ and a power source $V_{DD}$ respectively; a write-in circuit WRC constituted by an amplifier WA and three NAND gates NG1 through NG3, whose output terminals are connected to a pair of data bit lines DB and $\overline{DB}$; a sense amplifier SA connected to the pair of data bit lines DB and $\overline{DB}$; and an output buffer amplifier BA connected to the sense amplifier SA.

The RAM device of FIG. 2 still further comprises, according to the present invention, a high speed charging circuit constituted by MIS charging transistors $Q_{110}$ and $Q_{120}$ through $Q_{11(M-1)}$ and $Q_{12(M-1)}$ and by MIS transistors $Q_{13}$, $Q_{14}$, $Q_{15}$, $Q_{16}$, $Q_{17}$, .... The MIS charging transistors $Q_{110}$ and $Q_{120}$ through $Q_{11(M-1)}$ and $Q_{12(M-1)}$ are connected parallel to the load transistors $Q_{10}$ and $Q_{20}$ through $Q_{1(M-1)}$ and $Q_{2(M-1)}$, respectively. The MIS transistors $Q_{13}$, $Q_{14}$, $Q_{15}$, $Q_{16}$, $Q_{17}$, ... constitute a NOR gate to generate a control signal $S_C$ supplied to the gate electrodes of the MIS charging transistors $Q_{110}$ and $Q_{120}$ through $Q_{11(M-1)}$ and $Q_{12(M-1)}$. The MIS transistor $Q_{13}$ is a load transistor of the NOR gate. The gate electrodes of the MIS transistors $Q_{14}$ and $Q_{15}$ are connected to the word line $W_0$ at both ends thereof and the gate electrodes of the MIS transistors $Q_{16}$ and $Q_{17}$ are connected to the word line $W_1$ at both ends thereof. The other MIS transistors connected to the other word lines at both ends thereof are not shown in the drawing.

The charging transistors $Q_{110}$ and $Q_{120}$ through $Q_{11(M-1)}$ and $Q_{12(M-1)}$ are controlled by the output signal, i.e., the control signal $S_C$. That is, when all the transistors $Q_{14}$, $Q_{15}$, $Q_{16}$, $Q_{17}$, ... are in a turned off condition, the output signal $S_C$ of the NOR gate becomes high so that all the charging transistors $Q_{110}$ and $Q_{120}$ through $Q_{11(M-1)}$ and $Q_{12(M-1)}$ are turned on. On the contrary, when at least one of the transistors $Q_{14}$, $Q_{15}$, $Q_{16}$, $Q_{17}$, ... is in a turned on condition, the output signal $S_C$ of the NOR gate becomes low so that all the charging transistors $Q_{110}$ and $Q_{120}$ through $Q_{11(M-1)}$ and $Q_{12(M-1)}$ are turned off. The transistors $Q_{14}$ and $Q_{15}$ (or $Q_{16}$ and $Q_{17}$ or other transistors not shown in the drawing) detect the potential levels of one end portion of the word line $W_0$ (or $W_1$, ...) and of another end portion of the same word line $W'_0$ ($W'_1$, ...). Therefore, the charging transistors $Q_{110}$ and $Q_{120}$ through $Q_{11(M-1)}$ and $Q_{12(M-1)}$ are not turned on until the potential of all portions of the word lines $W_0$, $W_1$, ... becomes low level, i.e., the level of the non-selected conditions even when the potential of each portion of the word line does not change at the same time due to the propagation delay of the word line along the longitudinal direction thereof. On the contrary, the charging transistors $Q_{110}$ and $Q_{120}$ through $Q_{11(M-1)}$ and $Q_{12(M-1)}$ are turned on immediately after the output potential of at least one of the word decoders $WD_0$, $WD_1$, ... becomes high level, i.e., the potential level in the selected condition of the word line.

With reference to FIG. 3A through FIG. 3E, operation of the above-mentioned RAM device will now be explained. Assume that, as illustrated in FIG. 3A, the word address signal ADD has changed from ADD($W_0$) which selects the word line $W_0$ to ADD($W_1$) which selects the word line $W_1$ at a time $t_0$ and pairs of bit lines $B_0$ and $\overline{B}_0$ are continuously selected before and after the time $t_0$. That is, the memory cell $MC_{0,0}$ is selected before the time $t_0$ and the memory cell $MC_{1,0}$ is selected after the time $t_0$. Assume also that the read-out operations from both the memory cells $MC_{0,0}$ and $MC_{1,0}$ are sequentially effected and the memory cells $MC_{0,0}$ and $MC_{1,0}$ store different information from each other. In this condition, if the transistor $Q_5$ of the memory cell $MC_{0,0}$ is in a turned off condition and the transistor $Q_6$ of the same memory cell is in a turned on condition, the potentials of the bit lines $B_0$ and $\overline{B}_0$ are high (e.g. 3 V) and low (e.g. 2 V) respectively (FIG. 3D), the potentials of the word lines $W_0$ and $W_1$ are high and low respectively and the potentials of the end portions $W'_0$ and $W'_1$ of the word lines $W_0$ and $W_1$ are also high and low, respectively (FIG. 3B), at the time $t_0$. After the word address signal ADD has changed from ADD($W_0$) to ADD($W_1$), the output signal of the word decoder $WD_0$, i.e., the potential of the word line $W_0$, changes from high to low and the output signal of the word decoder $WD_1$, i.e., the potential of the word line $W_0$, changes from low to high. In this case, the potentials of the end portions $W'_0$ and $W'_1$ of the word lines $W_0$ and $W_1$ change a short time after the potential of the beginning portions of the word lines $W_0$ and $W_1$ have changed. In FIG. 3B, the curves of the potentials of the beginning portion of the word lines $W_0$ and $W_1$ are designated by the symbols $W_0$ and $W_1$ respectively. As a result, all the input signals of the NOR gate constituted by the transistors $Q_{13}$ through $Q_{17}$ and others become low at a time $t_1$ when the potential of the end portion $W'_0$ of the word line $W_0$ becomes low, so that the output signal $S_C$ of the NOR gate becomes high as illustrated in FIG. 3C. At a time $t_2$, the output potential $W_1$ of the word decoder $WD_1$ becomes high and the output signal $S_C$ of the NOR gate becomes low. Therefore, during the time period between $t_1$ and $t_2$, no word line is selected and the output signal $S_C$ becomes high. In the present invention, the charging transistors $Q_{110}$ and $Q_{120}$ through $Q_{11(M-1)}$ and $Q_{12(M-1)}$ are turned on during this non-selected time period and the bit lines $B_0$ and $\overline{B}_0$ are quickly charged through the charging transistors $Q_{110}$ and $Q_{120}$ and through the load transistors $Q_{10}$ and $Q_{20}$. Therefore, the potential curve of the bit line $\overline{B}_0$ rises quickly and crosses the potential curve of the bit line $B_0$ at a time $t_3$ as illustrated in FIG. 3D. A curve $\overline{B}'_0$ shown by the dotted line of FIG. 3D illustrates the charging characteristics of the conventional memory device of FIG. 1, in which the bit lines $B_0$ and $\overline{B}_0$ are charged only by the load transistors $Q_1$ and $Q_2$, respectively. The dotted line curve $\overline{B}'_0$ crosses the curve $B_0$ at a time $t_4$ which is later than the time $t_3$ by $\Delta t$. Since the transfer gate transistors $Q_{200}$ and $Q_{210}$ of FIG. 2 connected between the bit lines $B_0$ and $\overline{B}_0$ and the data bit lines DB and $\overline{DB}$ are in a turned on condition, the abovementioned potential changes are transferred to the sense amplifier SA and the buffer amplifier BA. The sense amplifier detects the potential change of the bit lines $B_0$ and $\overline{B}_0$ and changes the potential of the read-out signal $D_{out}$ after the cross point of the potential curves $B_0$ and $\overline{B}_0$ (or $\overline{B}'_0$). Therefore, according to the present invention, the access time of the RAM device can be increased by $\Delta t$. Since the charging transistors $Q_{110}$ and $Q_{120}$ through $Q_{11(M-1)}$ and $Q_{12(M-1)}$ are only turned on temporarily, the current consumption of the RAM device does not increase much.

In the above-mentioned memory device, the write-in of information to a memory cell, for example, $MC_{0,0}$ is effected by applying a write-in data signal $D_{in}$ and an inverted write enable signal $\overline{WE}$ of low potential level to the write-in circuit WRC and by turning on the transfer gate transistors $Q_{200}$ and $Q_{210}$ by the column decode signal $Y_0$ and the transistors $Q_3$ and $Q_4$ by the output signal of the word decoder $WD_0$. Assume that the potentials of the data bit lines DB and $\overline{DB}$ are caused to be high (e.g. 3 V) and low (e.g. 0 V) respectively according to the write-in data signal $D_{in}$ supplied to the write-in circuit WRC. These high and low potentials are transferred to the memory cell $MC_{0,0}$ through the transfer gate transistors $Q_{200}$ and $Q_{210}$ and through the transistors $Q_3$ and $Q_4$ and the write-in of information is effected.

If the read-out operation from the memory cell $MC_{1,0}$ is effected after the above-mentioned write-in to the memory cell $MC_{0,0}$ is effected and, if the data stored in the memory cell $MC_{1,0}$ is different from the data written into the memory cell $MC_{0,0}$, the bit line $\overline{B}_0$ must be charged from the low potential (0 V) of the write-in mode to the high potential (3 V) of the read-out mode quickly. In the RAM device according to the present invention, the charging transistors $Q_{110}$ and $Q_{120}$ through $Q_{11(M-1)}$ and $Q_{12(M-1)}$ are also turned on temporarily in a similar manner to the aforementioned case, and, therefore, the potential of the bit line $\overline{B}_0$ rises quicker than that of the conventional RAM device as illustrated in FIG. 3E. Therefore, in even the worst case, the access time of the RAM device of the present invention can be much shorter than that of the conventional RAM device.

As mentioned above, since the RAM device according to a present invention comprises the high speed charging circuit which charges all the bit lines during a short time when all the word lines are in a non-selected condition, the access time of the RAM device having a large memory capacity can be short without increasing the power consumption much, even when the size, and therefore the gm, of each of the load transistors of the bit lines is small.

I claim:

1. An improved semiconductor memory device of the type including a plurality of word lines, a plurality of bit lines crossing said word lines, a plurality of memory cells disposed at the cross points between said word lines and said bit lines, and load circuits each connected between one of said bit lines and a voltage source, a memory cell disposed at the cross point of a word line and a bit line being selected by selecting said word line and said bit line, wherein the improved memory device further comprises charging circuit means, operatively connected in parallel with said load circuits, for detecting the switching period when the potentials of all the word lines are at the potential level of a non-selected condition and for electrically charging all the bit lines during the switching period of word line potentials.

2. The memory device of claim 1, wherein said charging circuit means comprises gate circuit means for detecting the potential levels of all of said word lines and a plurality of charging transistors which are controlled by the output signal from said gate circuit means.

3. The memory device of claim 2, wherein said gate circuit means comprises a NOR gate having a plurality of input transistors and a load transistor connected to said input transistors.

4. The memory device of claim 2, wherein each of said charging transistors is connected parallel to a corresponding one of said load circuits.

5. The memory device of claim 2, wherein each of said word lines has a beginning portion and an end portion, and wherein said gate circuit means comprises means for detecting the potential levels at the beginning portion and the end portion of each of said word lines.

6. The memory device of claim 5, wherein said gate circuit means comprises a NOR gate having a plurality of input transistors numbering double the number of said word lines, and a load transistor, each of said input transistors being connected between one of the beginning portion of a word line and said load transistor and between the end portion of a word line and said load transistor.

7. A memory device of claim 1, 2, 3, 4, 5, or 6, wherein each of said memory cells is a flip-flop type memory cell comprising a pair of cross coupled MIS transistors, a pair of transfer gate MIS transistors and a pair of load resistors.

* * * * *

UNITED STATES PATENT AND TRADEMARK OFFICE
CERTIFICATE OF CORRECTION

PATENT NO. : 4,433,393
DATED : February 21, 1984
INVENTOR(S) : Oritani

It is certified that error appears in the above-identified patent and that said Letters Patent is hereby corrected as shown below:

Column 4, line 39, "increased" should be --decreased--;
        line 39, "chargng" should be --charging--;
Column 5, line 8, "the" should be --a--.

Signed and Sealed this

Twenty-first Day of August 1984

[SEAL]

Attest:

GERALD J. MOSSINGHOFF
*Attesting Officer*     *Commissioner of Patents and Trademarks*